United States Patent
Jo et al.

(10) Patent No.: US 10,834,794 B2
(45) Date of Patent: Nov. 10, 2020

(54) LED LIGHTING DEVICE AND DIMMING CONTROL METHOD THEREFOR

(71) Applicant: LG INNOTEK CO., LTD., Seoul (KR)

(72) Inventors: Ji Woong Jo, Seoul (KR); Jong Hyun Lee, Seoul (KR); Jae Ho Choi, Seoul (KR); Min Hak Kim, Seoul (KR); Min Su Seo, Seoul (KR); Seung Wan Baek, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 16/630,678

(22) PCT Filed: Jul. 12, 2018

(86) PCT No.: PCT/KR2018/007919
§ 371 (c)(1),
(2) Date: Jan. 13, 2020

(87) PCT Pub. No.: WO2019/017649
PCT Pub. Date: Jan. 24, 2019

(65) Prior Publication Data
US 2020/0146125 A1 May 7, 2020

(30) Foreign Application Priority Data
Jul. 21, 2017 (KR) .................. 10-2017-0092798

(51) Int. Cl.
*H05B 45/392* (2020.01)
*H05B 45/14* (2020.01)
*H01L 29/866* (2006.01)

(52) U.S. Cl.
CPC ......... *H05B 45/392* (2020.01); *H01L 29/866* (2013.01); *H05B 45/14* (2020.01)

(58) Field of Classification Search
CPC ...... H05B 45/392; H05B 45/14; H01L 29/866
See application file for complete search history.

(56) References Cited

U.S. PATENT DOCUMENTS

2011/0260645 A1 10/2011 Chen et al.
2012/0043902 A1 2/2012 Kanamori et al.
(Continued)

FOREIGN PATENT DOCUMENTS

KR 10-2009-0124215 12/2009
KR 10-2009-0128652 12/2009
(Continued)

OTHER PUBLICATIONS

TI Designs; Data Isolation for Loop-Powered Applications (Year: 2015).*

(Continued)

*Primary Examiner* — Renan Luque
(74) *Attorney, Agent, or Firm* — KED & Associates LLP

(57) ABSTRACT

An LED lighting device according to one embodiment of the present invention comprises: an LED array; a first control unit for controlling the dimming of the LED array; a second control unit for transmitting, to the first control unit, a dimming control signal for controlling the dimming of the LED array; and a transformer comprising a primary coil and a secondary coil spaced apart from each other, wherein the first control unit is connected to the primary coil, the second control unit is connected to the secondary coil, the primary coil and the secondary coil are insulated from each other, the transformer transmits a pulse signal that repeats on/off at predetermined intervals from the first control unit to the second control unit, and, when the pulse signal transmitted from the first control unit to the second control unit via the transformer becomes off, the dimming control signal is transmitted from the second control unit to the first control unit via the transformer and is used to control the dimming of the LED array.

18 Claims, 5 Drawing Sheets

(56) References Cited

U.S. PATENT DOCUMENTS

| | | | | |
|---|---|---|---|---|
| 2016/0295673 A1* | 10/2016 | Morici | ............... | H05B 47/175 |
| 2019/0215920 A1* | 7/2019 | Clauberg | .......... | H02M 3/33576 |
| 2019/0254145 A1* | 8/2019 | Abbo | .................... | H01F 38/14 |

FOREIGN PATENT DOCUMENTS

| | | |
|---|---|---|
| KR | 10-2011-0132188 | 12/2011 |
| KR | 10-2012-0018730 | 3/2012 |

OTHER PUBLICATIONS

International Search Report dated Oct. 12, 2018 issued in Application No. PCT/KR2018/007919.

\* cited by examiner

LED LIGHTING DEVICE AND DIMMING CONTROL METHOD THEREFOR

CROSS-REFERENCE TO RELATED PATENT APPLICATIONS

This application is a U.S. National Stage Application under 35 U.S.C. § 371 of PCT Application No. PCT/KR2018/007919, filed Jul. 12, 2018, which claims priority to Korean Patent Application No. 10-2017-0092798, filed Jul. 21, 2017, whose entire disclosures are hereby incorporated by reference.

TECHNICAL FIELD

The present invention relates to a light emitting diode (LED) lighting device, and more specifically, to a dimming control method of an LED lighting device.

BACKGROUND ART

A fluorescent lamp, an incandescent lamp, a light emitting diode (LED), and the like are used as indoor and outdoor lighting devices. Among the above, the lighting device using the LED has low power consumption and is semi-permanent in comparison with the fluorescent lamp.

FIG. 1 is an example of a lighting system including an LED lighting device.

Referring to FIG. 1, an LED lighting device 10 receives power from a power source 20 and includes an LED array 12 and a dimming circuit 14.

A plurality of LED lighting devices 10 can be controlled by one dimmer 30.

In this case, when a failure occurs due to an overvoltage such as a short circuit or surge to one of the plurality of LED lighting devices 10, the failure is spread to the dimmer 30 through DIM+ and DIM− wires. Accordingly, since the failure is spread to other LED lighting devices 10 which stably operate, secondary damage can occur.

Accordingly, there is an attempt to use a dimming circuit having an isolation structure. The dimming circuit having the isolation structure includes an isolation transformer which isolates a primary coil of an LED array and a secondary coil of a dimmer, and accordingly, the failure which occurs from the one LED lighting device may not be spread to other LED lighting devices.

Meanwhile, a dimming circuit having a general isolation structure uses a plurality of semiconductor elements, and thus has high circuit complexity, and it is difficult to accurately control dimming thereof. Further, since large inductance is demanded and thus the size of an isolation transformer increases, cost efficiency and space efficiency are low.

DISCLOSURE

Technical Problem

The present invention is directed to providing a light emitting diode (LED) lighting device including an isolation transformer, and a dimming control method thereof.

Technical Solution

One aspect of the present invention provides a light emitting diode (LED) lighting device including an LED array; a first control unit configured to control dimming of the LED array; a second control unit configured to transmit a dimming control signal, which controls the dimming of the LED array, to the first control unit; and a transformer including a primary coil and a secondary coil spaced apart from each other, wherein the first control unit is connected to the primary coil and the second control unit is connected to the secondary coil, the primary coil and the secondary coil are isolated from each other, the transformer transmits a pulse signal, which is repeatedly turned on and turned off at a predetermined interval, from the first control unit to the second control unit, the dimming control signal is transmitted from the second control unit to the first control unit through the transformer when the pulse signal transmitted from the first control unit to the second control unit through the transformer is turned off, and the first control unit rectifies the dimming control signal which is an alternating current signal transmitted from the second control unit to the first control unit through the transformer to a direct current signal and then controls the dimming of the LED array using a value in which an offset voltage is cancelled.

The first control unit may include a rectifier, which includes a diode configured to rectify the dimming control signal and a capacitor connected between the diode and a direct current power source, and an offset voltage cancellation part configured to cancel the offset voltage from a signal output from the rectifier, and the offset voltage may include a voltage value of the direct current power source.

The offset voltage cancellation part may cancel the offset voltage using voltage distribution.

The offset voltage cancellation part may include a plurality of resistors connected in series between the rectifier and the LED array, and a Zener diode or shunt regulator connected to one of the plurality of resistors in parallel.

The dimming control signal may be a signal in which a predetermined correction voltage is added to a voltage output from a dimmer.

The correction voltage may be generated by the plurality of resistors connected in series to the dimmer and the Zener diode or shunt regulator connected to the one of the plurality of resistors in parallel.

The offset voltage may further include the correction voltage.

Another aspect of the present invention provides a dimming control method of a light emitting diode (LED) lighting device including: generating a pulse signal, which is repeatedly turned on and turned off at a predetermined interval, in a first control unit including an LED array; transmitting the pulse signal generated in the first control unit to a second control unit including a dimmer through a transformer; transmitting, by the second control unit, a dimming control signal which controls the LED array to the first control unit through the transformer when the pulse signal of the first control unit transmitted through the transformer is turned off; rectifying, by the first control unit, the dimming control signal, which is an alternating current signal transmitted through the transformer, to a direct current signal; cancelling, by the first control unit, an offset voltage from the rectified signal; and controlling, by the first control unit, dimming of the LED array using a signal from which the offset voltage is cancelled.

A voltage of the signal from which the offset voltage is cancelled may be the same as a voltage output from the dimmer.

Advantageous Effects

According to an embodiment of the present invention, a simple structure can be realized, and a dimming circuit having high accuracy and isolation can be obtained using a small number of switching elements. Accordingly, dimming of a light emitting diode (LED) lighting device is easy and production costs of the LED lighting device can be reduced. Further, according to the embodiment of the present invention, since accuracy of dimming is not largely influenced by an inductance value of a transformer, the inductance value can be designed to be low, and a transformer having a small size can be used.

MODES OF THE INVENTION

Hereinafter, preferable embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C".

In addition, terms such as first, second, A, B, (a), (b), and the like may be used to describe elements of the embodiments of the present invention.

The terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included with respect to one element.

Figure 1:
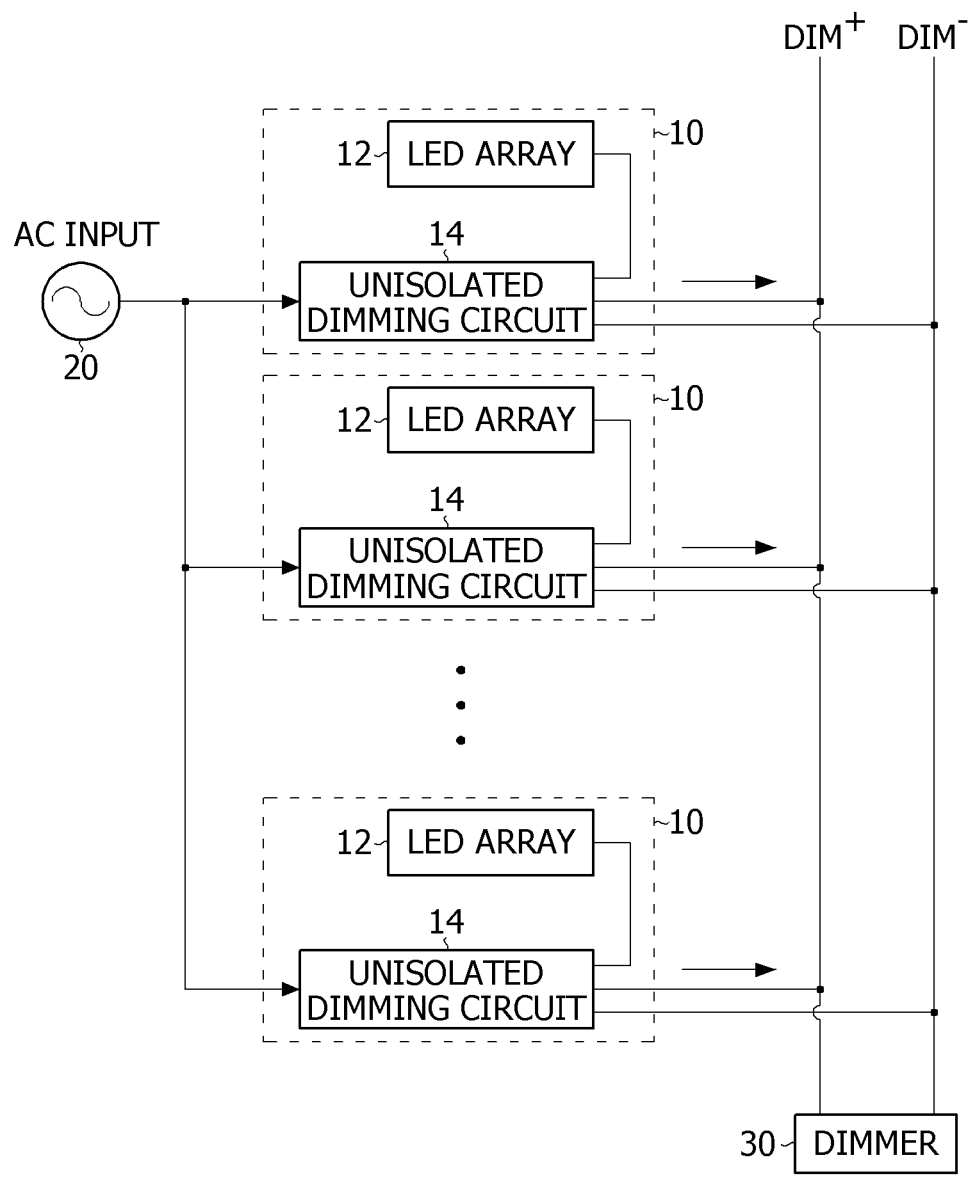
FIG. 1 is an example of a lighting system including a light emitting diode (LED) lighting device.
Figure 2:
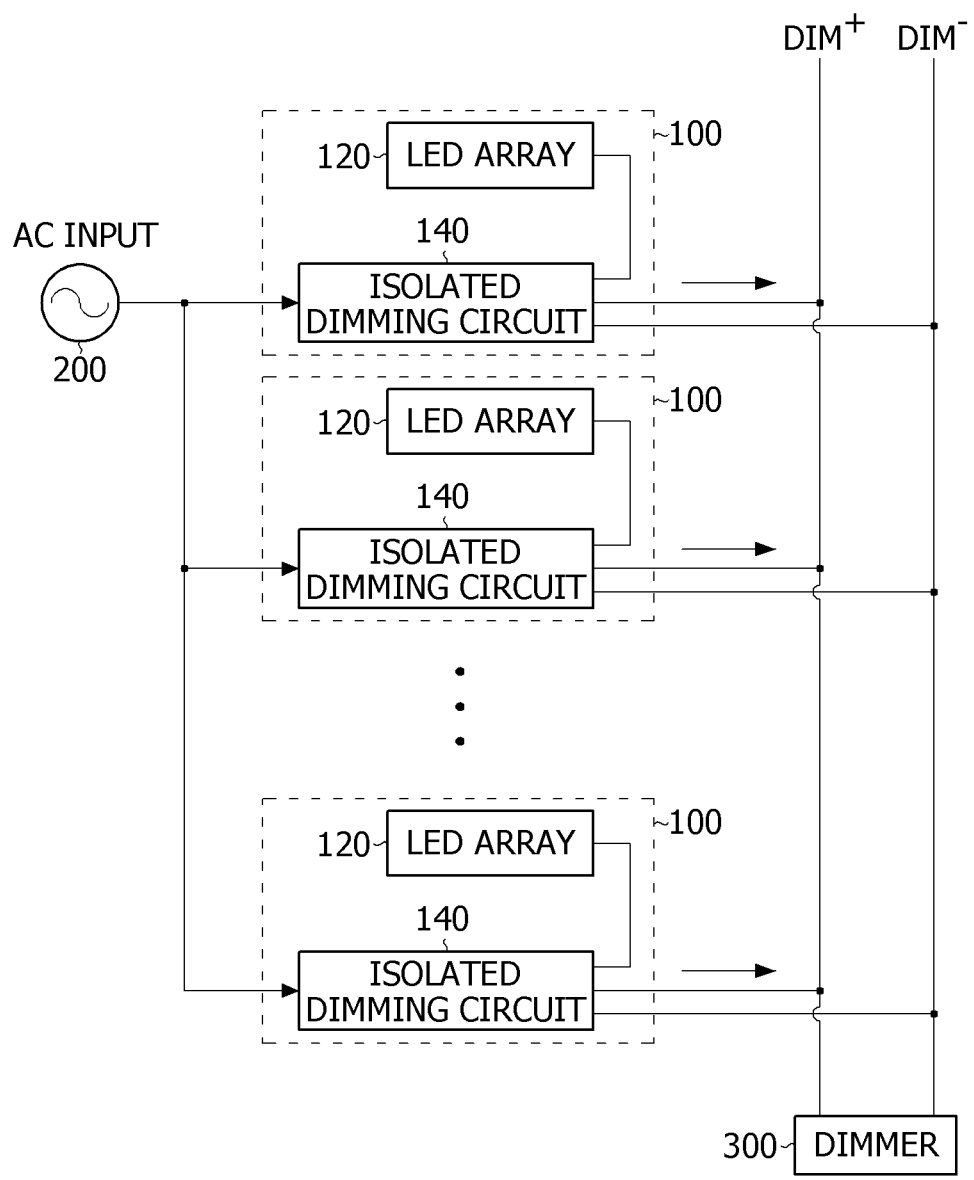
FIG. 2 illustrates a lighting system including an LED lighting device according to one embodiment of the present invention.

FIG. 2 illustrates a lighting system including a light emitting diode (LED) lighting device according to one embodiment of the present invention.

Referring to FIG. 2, an LED lighting device 100 receives power from a power source 200 and includes an LED array 120 and a dimming circuit 140.

A plurality of LED lighting devices 100 may be controlled by one dimmer 300.

In this case, the dimming circuit 140 is an isolation dimming circuit including a transformer which isolates a primary coil in the LED array 120 and a secondary coil in the dimmer 300. Accordingly, even when a failure occurs due to an overvoltage such as a short circuit or surge to one of the plurality of LED lighting devices 100, a problem that the failure is spread to the dimmer 300 or is spread to another LED lighting device 10 adjacent to the one LED lighting device may be prevented.

Figure 3:
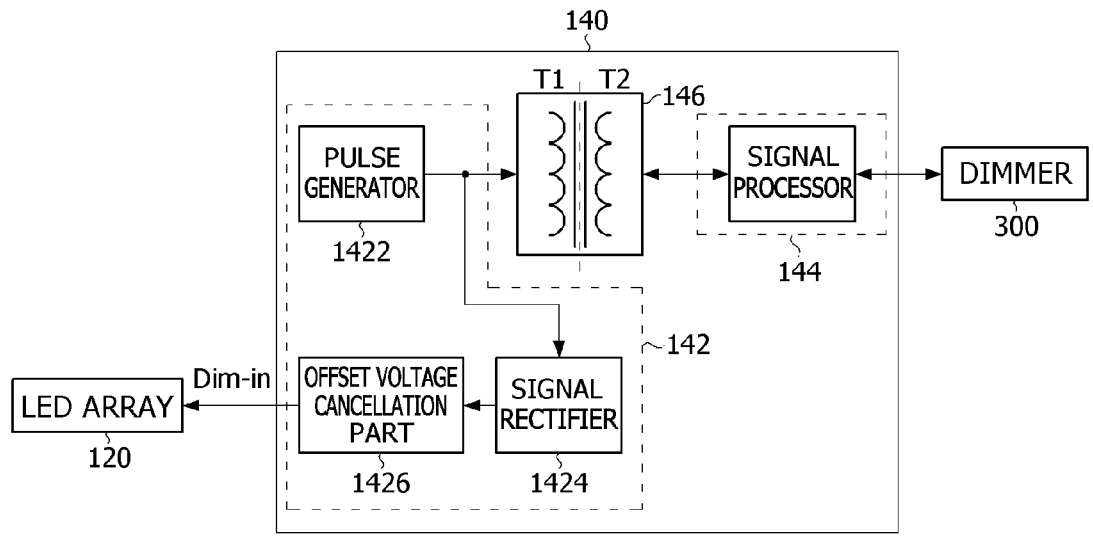
FIG. 3 is a block diagram of the lighting system in the LED lighting device according to one embodiment of the present invention.
Figure 4:
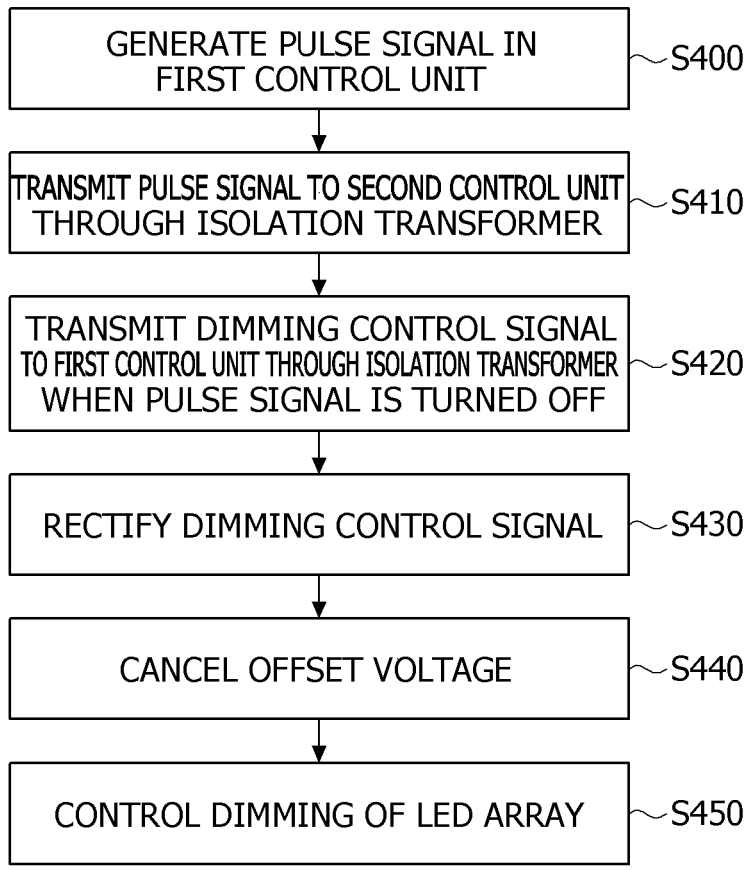
FIG. 4 is a flow chart illustrating a dimming control method of the LED lighting device according to one embodiment of the present invention.

FIG. 3 is a block diagram of the lighting system in the LED lighting device according to one embodiment of the present invention, and FIG. 4 is a flow chart illustrating a dimming control method of the lighting system in the LED lighting device according to one embodiment of the present invention.

Referring to FIG. 3, the dimming circuit 140 includes a first control unit 142, a second control unit 144, and a transformer 146.

The first control unit 142 is connected to the LED array 120 and controls dimming of the LED array 120. The second control unit 144 is connected to the dimmer 300 and receives a dimming control signal for controlling the LED array 120 from the dimmer 300 and then transmits the dimming control signal to the first control unit 142. Further, the transformer 146 includes a primary coil T1 and a secondary coil T2 spaced apart from each other, and the primary coil T1 may be connected to the first control unit 142 and the secondary coil T2 may be connected to the second control unit 144. In addition, in the transformer 146 according to the embodiment of the present invention, the primary coil T1 and the secondary coil T2 may be isolated. Accordingly, in the specification, the transformer 146 may be used together with the isolation transformer 146. Further, the transformer 146 may have a turn ratio of 1 to 1 between the primary coil T1 and the secondary coil T2 and operate in a flyback manner.

More specifically, referring to FIGS. 3 and 4, the first control unit 142 may include a pulse generator 1422, a signal rectifier 1424, and an offset voltage cancellation part 1426, and the second control unit 144 may be used together with a signal processor.

The pulse generator 1422 of the first control unit 142 generates a pulse signal, which is repeatedly turned on and turned off at a predetermined interval (S400), and transmits the generated pulse signal to the second control unit 144 through the transformer 146 (S410). In this case, the pulse signal may be a pulse width modulation (PWM) signal and may be a signal having a predetermined duty ratio with respect to a voltage value of direct current power input to the first control unit 142, for example, a duty ratio of 30%.

When the pulse signal transmitted from the first control unit 142 to the second control unit 144 through the transformer 146 is turned off, the second control unit 144 transmits the dimming control signal for controlling the LED array 120 to the first control unit 142 through the transformer 146 (S420). Here, the dimming control signal may have a value output from the dimmer 300 to control brightness of the LED array 120 and have a value set by a user or a value automatically set according to ambient light. For example, the dimming control signal may have a value of 0 to 10 V, or 1 to 10 V, and accordingly, the LED array 120 becomes brighter when the value increases, and the LED array 120 becomes darker when the value decreases. Alternatively, the dimming control signal may be a signal in which a predetermined correction voltage is added to the voltage output from the dimmer 300. The predetermined correction voltage may be a value added so that the dimming control signal is processed to be readable in the first control unit 142 or so that the voltage output from the dimmer 300 maintains a stable value.

The dimming control signal transmitted from the second control unit 144 to the first control unit 142 through the transformer 146 may be an alternating current signal. Accordingly, the first control unit 142 rectifies the dimming control signal which is the alternating current signal to a direct current signal (S430). To this end, the signal rectifier 1424 may include a diode and a capacitor, and the dimming control signal transmitted from the second control unit 144 may be rectified to the direct current signal through the diode and then stored in the capacitor. In this case, one end of the capacitor may be connected to the direct current power source, and accordingly, a value output from the signal rectifier 1424 may be a value in which a voltage value of the direct current power is added to the dimming control signal transmitted from the second control unit 144.

Further, the offset voltage cancellation part 1426 of the first control unit 142 cancels an offset voltage from a signal rectified by the signal rectifier 1424 of the first control unit 142 (S440) and then controls the dimming of the LED array 120 (S450). The offset voltage may refer to a value added to the voltage output from the dimmer 300 to control the dimming of the LED array 120. For example, the offset voltage may include the voltage value of the direct current power added in the signal rectifier 1424. Alternatively, the offset voltage may further include the correction voltage added to the voltage output from the dimmer 300 in the second control unit 144. Accordingly, a voltage of the signal from which the offset voltage is cancelled may be the same as the voltage output from the dimmer 300.

Although not shown, a main control unit (MCU) may be further disposed between the offset voltage cancellation part 1426 and the LED array 120. When the offset voltage is cancelled, the dimming control signal may be converted to a value which is the same as a value of the voltage output from the dimmer 300, that is, a value readable by the MCU.

Hereinafter, it will be described more specifically with reference to a circuit diagram.

Figure 5:
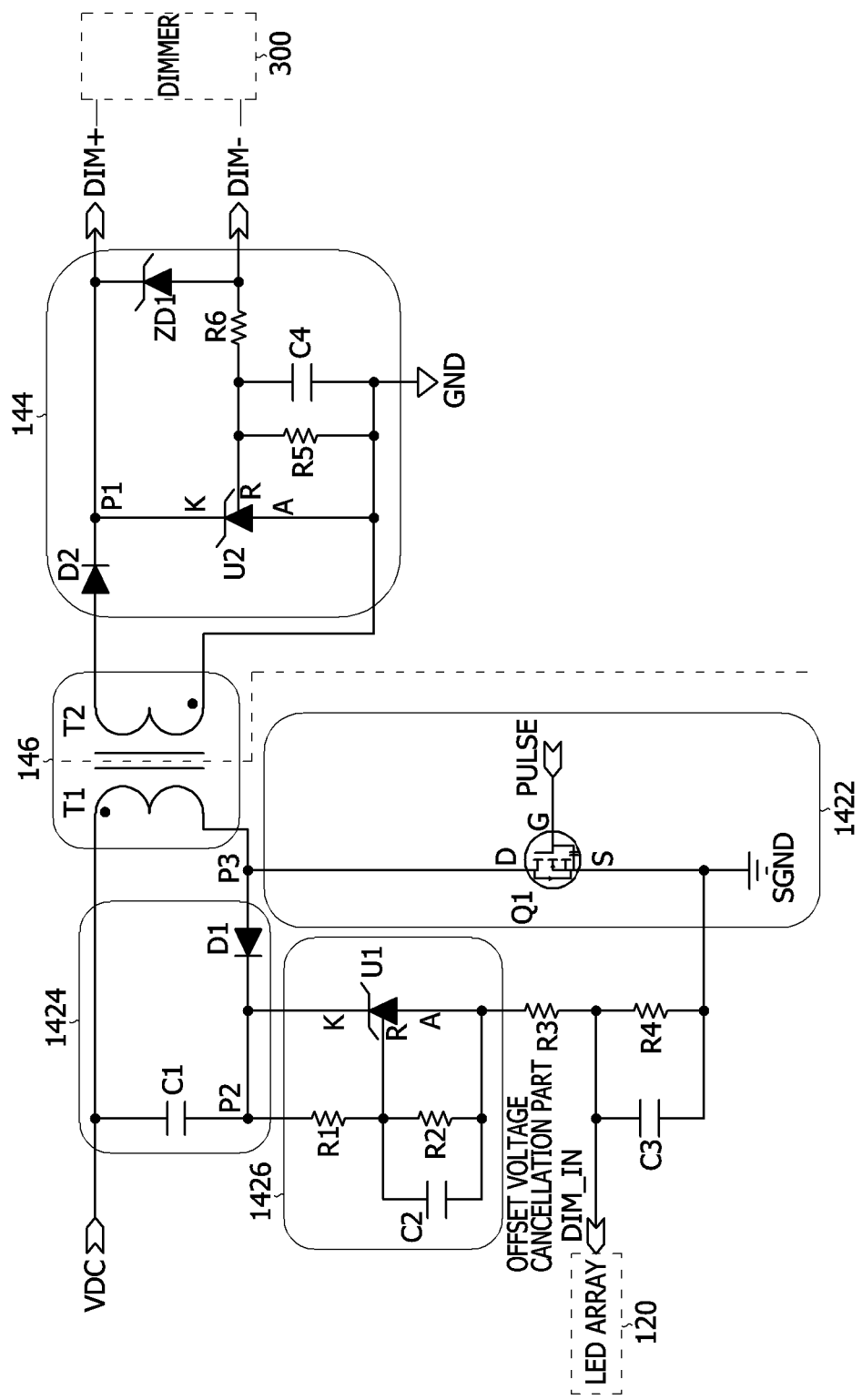
FIG. 5 illustrates a circuit diagram of a dimming circuit in the LED lighting device according to one embodiment of the present invention.

FIG. 5 illustrates a circuit diagram of a dimming circuit in the LED lighting device according to one embodiment of the present invention.

Referring to FIG. 5, the dimming circuit 140 includes the first control unit 142, the second control unit 144, and the transformer 146.

The first control unit 142 is connected to the LED array 120 and controls the dimming of the LED array 120. The second control unit 144 is connected to the dimmer 300 and receives the dimming control signal for controlling the LED array 120 from the dimmer 300 and then transmits the dimming control signal to the first control unit 142. Here, it is shown and described that the first control unit 142 and the LED array 120 are separate configurations and the first control unit 142 is connected to the LED array 120, but the present invention is not limited thereto. The first control unit 142 may be included in the LED array 120 or the LED array may be included in the first control unit 142. As described above, it is shown and described that the second control unit 144 and the dimmer 300 are separate configurations and the second control unit 144 is connected to the dimmer 300, but the present invention is not limited thereto. The second control unit 144 may be included in the dimmer 300 or the dimmer 300 may be included in the second control unit 144. Further, the transformer 146 includes the primary coil T1 connected to the first control unit 142 and the secondary coil T2 connected to the second control unit 144, and the primary coil T1 and the secondary coil T2 are isolated. Here, the transformer 146 may have a turn ratio of 1 to 1 between the primary coil T1 and the secondary coil T2 and operate in the flyback manner.

More specifically, the first control unit 142 may include the pulse generator 1422, the signal rectifier 1424, and the offset voltage cancellation part 1426, and the second control unit 144 may be used together with the signal processor.

The pulse generator 1422 of the first control unit 142 generates a pulse signal which is repeatedly turned on and turned off at a predetermined interval. The pulse generator 1422 includes a transistor Q1, for example, a field effect transistor (FET), and the pulse signal may be applied to a gate electrode of the transistor Q1. Further, a drain electrode of the transistor Q1 may be connected to the primary coil T1 of the transformer 146.

Accordingly, the pulse signal generated from the pulse generator 1422 is transmitted to the second control unit 144 through the transformer 146. In this case, the pulse signal may have a predetermined duty ratio with respect to a Volts Direct Current (VDC) which is a voltage value of the direct current power input to the first control unit 142. For example, when VDC is 12 V and the duty ratio is 30%, a pulse signal of which the duty ratio of 12 V is 30% is ordinarily applied to a P1 node of the second control unit 144.

Meanwhile, when the dimmer 300 outputs a voltage value for controlling the dimming of the LED array 120, the second control unit 144, that is, a signal processor, receives the dimming control signal from the dimmer 300 through a DIM+ line and a DIM− line. Here, the dimming control signal has a value output from the dimmer 300 to control the brightness of the LED array 120, and may have a value set by the user or a value automatically set according to the ambient light. For example, the dimming control signal may have a value of 0 to 10 V or 1 to 10 V, and accordingly, the LED array 120 becomes brighter when the value increases, and the LED array 120 becomes darker when the value decreases. In order to obtain a constant voltage, a Zener diode ZD1 may be connected between the DIM+ line and the DIM− line In this case, the second control unit 144 may add a predetermined correction voltage to the voltage output from the dimmer 300. The predetermined correction voltage may be a value added so that the dimming control signal is processed to be readable in the first control unit 142, or the voltage output from the dimmer 300 maintains a stable value. The correction voltage may be added by voltage distribution. To this end, the second control unit 144 may include two resistors R5 and R6 connected in series to the DIM−, a shunt regulator U2 or Zener diode connected to the resistor R5 in parallel, and a capacitor C4 connected to the resistor R5 in parallel. A level of the correction voltage may be controlled according to a resistance ratio between the two resistors R5 and R6, and a stable value may be maintained according to the shunt regulator or Zener diode.

Figure 6:
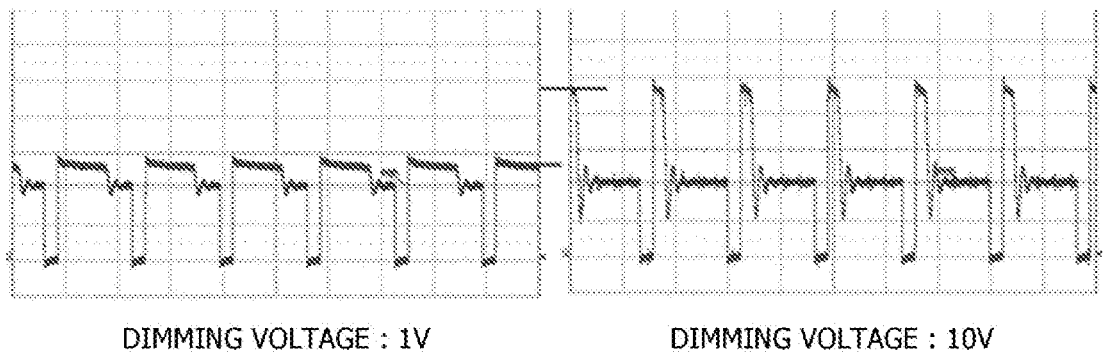
FIG. 6 illustrates an example of dimming control information transmitted to a P3 node.

Although the pulse signal transmitted from the first control unit 142 is ordinarily applied to the P1 node, when the voltage value for controlling the dimming of the LED array 120 is output from the dimmer 300, the dimming control signal is applied to the P1 node. Further, when the pulse signal transmitted from the first control unit 142 is turned off, the value applied to the P1 node is applied to the first control unit 142 through the transformer 146 using the flyback manner. Accordingly, the dimming control signal transmitted from the second control unit 144 may be reflected to a P3 node of the first control unit 142. FIG. 6 illustrates an example of dimming control information transmitted to the P3 node. In FIG. 6, an example in which the value of the voltage output from the dimmer 300 has a value of 1 V and a value of 10 V is described.

Further, the dimming control signal reflected to the P3 node is rectified by the signal rectifier 1424 of the first control unit 142. To this end, the signal rectifier 1424 may include a diode D1 and a capacitor C1. One end of the diode may be connected to the P3 node, and the other end may be connected to the P2 node. Further, one end of the capacitor C1 may be connected to VDC which is the direct current power, and the other end of the capacitor C1 may be connected to the P2 node. Accordingly, the dimming control signal which is an alternating current signal reflected to the P3 node is rectified to the direct current signal through the diode D1 and then stored in the capacitor C1. Accordingly, a value in which the voltage value of the direct current power (VDC) is added to the dimming control signal reflected to the P3 node may be applied to the P2 node. To this end, the signal rectifier 1424 may include some components of a snubber circuit. The snubber circuit is a circuit which serves to cut spikes due to a cap component of the pulse signal and may be used to detect a level of the dimming control signal.

Further, the offset voltage cancellation part 1426 of the first control unit 142 cancels the offset voltage from a voltage applied to the P2 node and then controls the dimming of the LED array 120. The offset voltage may be a value added to the value of the voltage output from the dimmer 300. For example, the offset voltage may include the voltage value of the direct current power added in the signal rectifier 1424. The offset voltage may further include a predetermined correction voltage added in the second control unit 144.

The offset voltage cancellation part 1426 may cancel the offset voltage using the voltage distribution. To this end, the offset voltage cancellation part 1426 may include two resistors R1 and R2 which are connected in series, a shunt regulator U1, and a capacitor 2, one end of the resistor R1 may be connected to the P2 node, the other end of the resistor R1 may be connected to the other resistor R2, and the capacitor 2 and the shunt regulator U1 may be connected to the resistor R2 in parallel. Accordingly, the offset voltage may be cancelled from the voltage applied to the P2 node, and a value actually output from the dimmer 300 may be applied for the dimming of the LED array 120.

According to the embodiment of the present invention, since the dimming circuit includes the isolation transformer, although a failure occurs in one LED lighting device in the lighting system including the plurality of LED lighting devices, the failure may not be spread to other LED lighting device or the dimmer.

Further, according to the embodiment of the present invention, the pulse signal of the first control unit is transmitted to the second control unit, and the dimming control signal of the second control unit is transmitted to the first control unit in the flyback manner, and then a rectifying process and an offset voltage cancelling process are performed, and thus accurate dimming control may be performed using a simple circuit structure.

Although preferable embodiments of the present invention are described above, those skilled in the art may variously modify and change the present invention within the scope of the spirit and the area of the present invention disclosed in the claims which will be described later.

| [Reference numerals] | |
|---|---|
| 100: LED lighting device | 120: LED array |
| 140: dimming circuit | 142: first control unit |
| 144: second control unit | 146: isolation transformer |
| 300: dimmer | 1422: pulse generator |
| 1424: signal rectifier | 1426: offset voltage cancellation part |

The invention claimed is:

1. A light emitting diode (LED) lighting device comprising:
   an LED array;
   a first control unit configured to control dimming of the LED array;
   a second control unit configured to transmit a dimming control signal, which controls the dimming of the LED array, to the first control unit; and
   a transformer including a primary coil and a secondary coil spaced apart from each other,
   wherein the first control unit is connected to the primary coil and the second control unit is connected to the secondary coil,
   the primary coil and the secondary coil are isolated from each other,
   the transformer transmits a pulse signal, which is repeatedly turned on and turned off at a predetermined interval, from the first control unit to the second control unit,
   the dimming control signal is transmitted from the second control unit to the first control unit through the transformer when the pulse signal transmitted from the first control unit to the second control unit through the transformer is turned off, and
   the first control unit rectifies the dimming control signal which is an alternating current signal transmitted from the second control unit to the first control unit through the transformer to a direct current signal and then controls the dimming of the LED array using a value in which an offset voltage is cancelled, wherein:
   the first control unit includes a rectifier, which includes a diode configured to rectify the dimming control signal and a capacitor connected between the diode and a direct current power source, and an offset voltage cancellation part configured to cancel the offset voltage from a signal output from the rectifier; and
   the offset voltage includes a voltage value of the direct current power source.

2. The LED lighting device of claim 1, wherein the offset voltage cancellation part cancels the offset voltage using voltage distribution.

3. The LED lighting device of claim 2, wherein the offset voltage cancellation part includes a plurality of resistors connected in series between the rectifier and the LED array, and a Zener diode or a shunt regulator connected to one of the plurality of resistors in parallel.

4. The LED lighting device of claim 1, wherein the dimming control signal is a signal in which a predetermined correction voltage is added to a voltage output from a dimmer.

5. The LED lighting device of claim 4, wherein a correction voltage is generated by the plurality of resistors connected in series to a dimmer and the Zener diode or shunt regulator connected to one of the plurality of resistors in parallel.

6. The LED lighting device of claim 5, wherein the offset voltage further includes the correction voltage.

7. The LED lighting device of claim 1, wherein a turn ratio between the primary coil and the secondary coil of the transformer is 1 to 1 and the transformer operates in a flyback manner.

8. The LED lighting device of claim 1, wherein the pulse signal is a signal having a predetermined duty ratio with respect to a voltage value of direct current power input to the first control unit.

9. The LED lighting device of claim 1, wherein the dimming control signal has a value set by a user or a value automatically set according to ambient light.

10. The LED lighting device of claim 9, wherein a MCU (main control unit) is further disposed between the first control unit and the LED array.

11. The LED lighting device of claim 1, wherein one end of the diode is connected to a first node of the first control unit on which the dimming control signal is reflected, one end of the capacitor is connected to the direct current power, and the other end of the diode is connected to the other end of the capacitor.

12. The LED lighting device of claim 1, wherein the first control unit further includes a pulse generator to generate the pulse signal.

13. The LED lighting device of claim 12, wherein the pulse generator includes a transistor, a pulse signal is applied to a gate electrode of the transistor, and a drain electrode of the transistor is connected to the primary coil.

14. The LED lighting device of claim 4, wherein the correction voltage is added by voltage distribution.

15. The LED lighting device of claim 4, wherein the second control unit receives the dimming control signal from the dimmer through a DIM+ line and a DIM− line, and a Zener diode is connected between the DIM+ line and the DIM− line.

16. The LED lighting device of claim 5, wherein a level of the correction voltage is controlled according to a resistance ratio between the plurality of resistors.

17. A dimming control method of a light emitting diode (LED) lighting device, comprising:
generating a pulse signal, which is repeatedly turned on and turned off at a predetermined interval, in a first control unit including an LED array;
transmitting the pulse signal generated in the first control unit to a second control unit including a dimmer through a transformer;
transmitting, by the second control unit, a dimming control signal which controls the LED array to the first control unit through the transformer when the pulse signal of the first control unit transmitted through the transformer is turned off;
rectifying, by the first control unit, the dimming control signal, which is an alternating current signal transmitted through the transformer, to a direct current signal;
cancelling, by the first control unit, an offset voltage from the rectified signal; and
controlling, by the first control unit, dimming of the LED array using a signal from which the offset voltage is cancelled, wherein:
the dimming control signal is rectified using a diode and then a voltage of a direct current power source is added in the rectified direct current signal; and
the voltage of the direct current power source is cancelled in the cancelling of the offset voltage.

18. The dimming control method of claim 17, wherein a voltage of the signal from which the offset voltage is cancelled is the same as a voltage output from the dimmer.

* * * * *